(12) United States Patent
Choi et al.

(10) Patent No.: US 7,936,111 B2
(45) Date of Patent: May 3, 2011

(54) APPARATUS FOR GENERATING ELECTRICAL ENERGY AND METHOD FOR MANUFACTURING THE SAME

(75) Inventors: Jaeyoung Choi, Yongin-si (KR);
Sang-Woo Kim, Yongin-si (KR);
Dukhyun Choi, Hwaseong-si (KR)

(73) Assignees: Samsung Electronics Co., Ltd. (KR);
Kumoh National Institute of Technology (KR)

( * ) Notice: Subject to any disclaimer, the term of this patent is extended or adjusted under 35 U.S.C. 154(b) by 0 days.

(21) Appl. No.: 12/350,584

(22) Filed: Jan. 8, 2009

(65) Prior Publication Data
US 2010/0033059 A1    Feb. 11, 2010

(30) Foreign Application Priority Data

Aug. 7, 2008   (KR) .................. 10-2008-0077595
Dec. 5, 2008   (KR) .................. 10-2008-0123612

(51) Int. Cl.
*H01L 41/113* (2006.01)
(52) U.S. Cl. ........................................ 310/339
(58) Field of Classification Search ............ 310/339
See application file for complete search history.

(56) References Cited

U.S. PATENT DOCUMENTS

| | | | |
|---|---|---|---|
| 7,705,523 B2* | 4/2010 | Wang et al. ............. | 310/339 |
| 2006/0119587 A1 | 6/2006 | Aroyan et al. | |
| 2008/0067618 A1 | 3/2008 | Wang et al. | |
| 2008/0100182 A1* | 5/2008 | Chang et al. ............. | 310/339 |
| 2008/0123078 A1 | 5/2008 | Saraf | |
| 2008/0251865 A1* | 10/2008 | Pinkerton ............. | 257/414 |
| 2009/0115293 A1* | 5/2009 | Wang et al. ............. | 310/364 |
| 2009/0179523 A1* | 7/2009 | Wang et al. ............. | 310/338 |
| 2009/0295257 A1* | 12/2009 | Wang et al. ............. | 310/367 |

(Continued)

FOREIGN PATENT DOCUMENTS

JP          1990-001519          1/1990
(Continued)

OTHER PUBLICATIONS

Zhaoyu Wang, et al., "Voltage Generation from Individual BaTiO3 Nanowires under Periodic Tensile Mechanical Load", Nano Letters 2007 vol. 7, No. 10, pp. 2966-2969.

(Continued)

*Primary Examiner* — Thomas M Dougherty
(74) *Attorney, Agent, or Firm* — Cantor Colburn LLP

(57) ABSTRACT

An apparatus for generating electrical energy including a first electrode, a second electrode and one or more nanowires, and a method for manufacturing the apparatus for generating electrical energy. The second electrode may have a concave portion and a convex portion. The first electrode and the nanowire are formed of different materials. The nanowire is formed on the first electrode and is positioned between the first electrode and the second electrode. Because the nanowire is formed on the first electrode, the nanowire may be grown vertically and the uniformity and conductivity of the nanowires may be improved. When a stress is applied to the first electrode or the second electrode, the nanowire is deformed and an electric current is generated from the nanowire due to a piezoelectric effect of the nanowire and a Schottky contact between the nanowire and the electrode which makes contact with the nanowire. Accordingly, when the apparatus for generating electrical energy is bent or pressed in part, electrical energy is generated in response to the applied stress.

7 Claims, 15 Drawing Sheets

U.S. PATENT DOCUMENTS

2009/0309456 A1* 12/2009 Stollberg .................. 310/319
2009/0309458 A1* 12/2009 Chou ........................ 310/339

FOREIGN PATENT DOCUMENTS

WO    WO-2007/076254 A2 *    7/2007

OTHER PUBLICATIONS

Yong Lei, et al., "Ordered Arrays of Nanostructures and Applications in High-Efficient Nano-Generators", Advanced Engineering Materials 2007, 9, No. 5, pp. 343-348.

Yong Qin, et al., "Microfibre-nanowire hybrid structure for energy scavenging", vol. 451, Feb. 14, 2008, doi:10.1038/nature06601, pp. 809-814.

Michael R. McDevitt, et al., "Tumor Therapy with Targeted Atomic Nanogenerators", Science vol. 294, 1Nov. 16, 2001, pp. 1537-1540.

Zhong Lin Wang, et al., "Piezoelectric Nanogenerators Based on Zinc Oxide Nanowire Arrays", Science vol. 312, Apr. 14, 2006, pp. 242-246.

Xudong Wang, et al., "Direct-Current Nanogenerator Driven by Ultrasonic Waves", Science vol. 316, Apr. 6, 2007, pp. 102-105.

* cited by examiner

APPARATUS FOR GENERATING ELECTRICAL ENERGY AND METHOD FOR MANUFACTURING THE SAME

CROSS-REFERENCE TO RELATED APPLICATION

This application claims priority to Korean Patent Application No. 10-2008-77595 filed on Aug. 7, 2008, and Korean Patent Application No. 10-2008-123612 filed on Dec. 5, 2008, and all the benefits accruing therefrom under 35 U.S.C. §119, the contents of which in its entirety are herein incorporated by reference.

BACKGROUND

1. Field

Exemplary embodiments relate to an apparatus for generating electrical energy and a method for manufacturing the same, more particularly to an apparatus for generating electrical energy using a Schottky contact formed between a nanowire exhibiting a piezoelectric effect and an electrode placed on the nanowire.

2. Description of the Related Art

A touch sensor detects the stress applied to devices, and may be used in a touchscreen or other applications. When a user touches the screen with a finger or other body part, the touch sensor detects the stress applied to the screen and registers the applied stress as an input signal.

In such a touch sensor, a voltage may be applied to one or more edge portions of a screen. When a user's finger or body part contacts the screen, the stress applied to the screen from the finger or body part may be detected as on a resistance change or voltage drop.

SUMMARY

In one exemplary embodiment there is provided an apparatus for generating electrical energy which generates electrical energy in response to applied stress. In another exemplary embodiment, there is provided a method for manufacturing the apparatus for generating electrical energy.

In another exemplary embodiment, there is provided an apparatus for generating electrical energy including a first electrode, a second electrode and a nanowire. The second electrode may have a concave portion and a convex portion. The nanowire is formed on the first electrode and is positioned between the first electrode and the second electrode. The first electrode and the nanowire are formed of different materials. When a stress is applied to the first electrode or the second electrode, the nanowire is deformed, and an electrical current is generated from the nanowire owing to the piezoelectric effect of the nanowire and a Schottky contact that is formed between the nanowire and the electrode which makes contact with the nanowire.

In another exemplary embodiment, there is provided a method for manufacturing the apparatus for generating electrical energy. In another exemplary embodiment, the apparatus for generating electrical energy is manufactured by forming a nanowire on a first electrode layer disposed on a substrate, the first electrode layer and the nanowire being formed different materials; preparing a second electrode layer having a concave portion and a convex portion facing the first electrode layer, the second electrode layer being spaced apart from the first electrode layer; with the nanowire of the first electrode in proximity to the second electrode layer; and connecting the first electrode layer with the second electrode layer using a conductor.

BRIEF DESCRIPTION OF THE DRAWINGS

The above and other aspects, features and other advantages of the exemplary embodiments will be more clearly understood from the following detailed description taken in conjunction with the accompanying drawings, in which.

DETAILED DESCRIPTION

Figure 1:
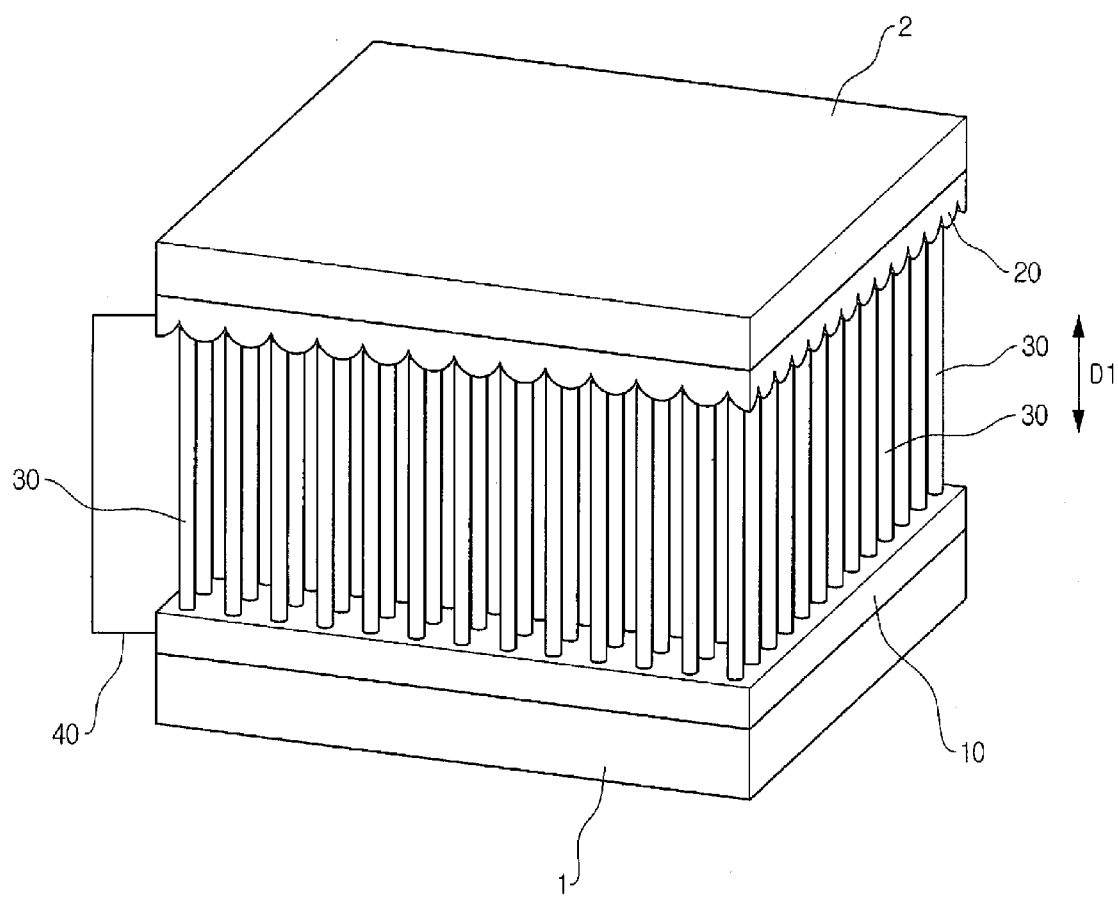
FIG. 1 is a perspective view showing an exemplary embodiment of an apparatus for generating electrical energy according to the present invention.

Exemplary embodiments now will be described more fully hereinafter with reference to the accompanying drawings, in which exemplary embodiments are shown. The invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the description, details of well-known features and techniques may be omitted to avoid unnecessarily obscuring the presented embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, the use of the terms a, an, etc. do not denote a limitation of quantity, but rather denote the presence of at least one of the referenced item. The use of the terms "first", "second", and the like do not imply any particular order, but are included to identify individual elements. Moreover, the use of the terms first, second, etc. do not denote any order or importance, but rather the terms first, second, etc. are used to distinguished one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

Figure 2:
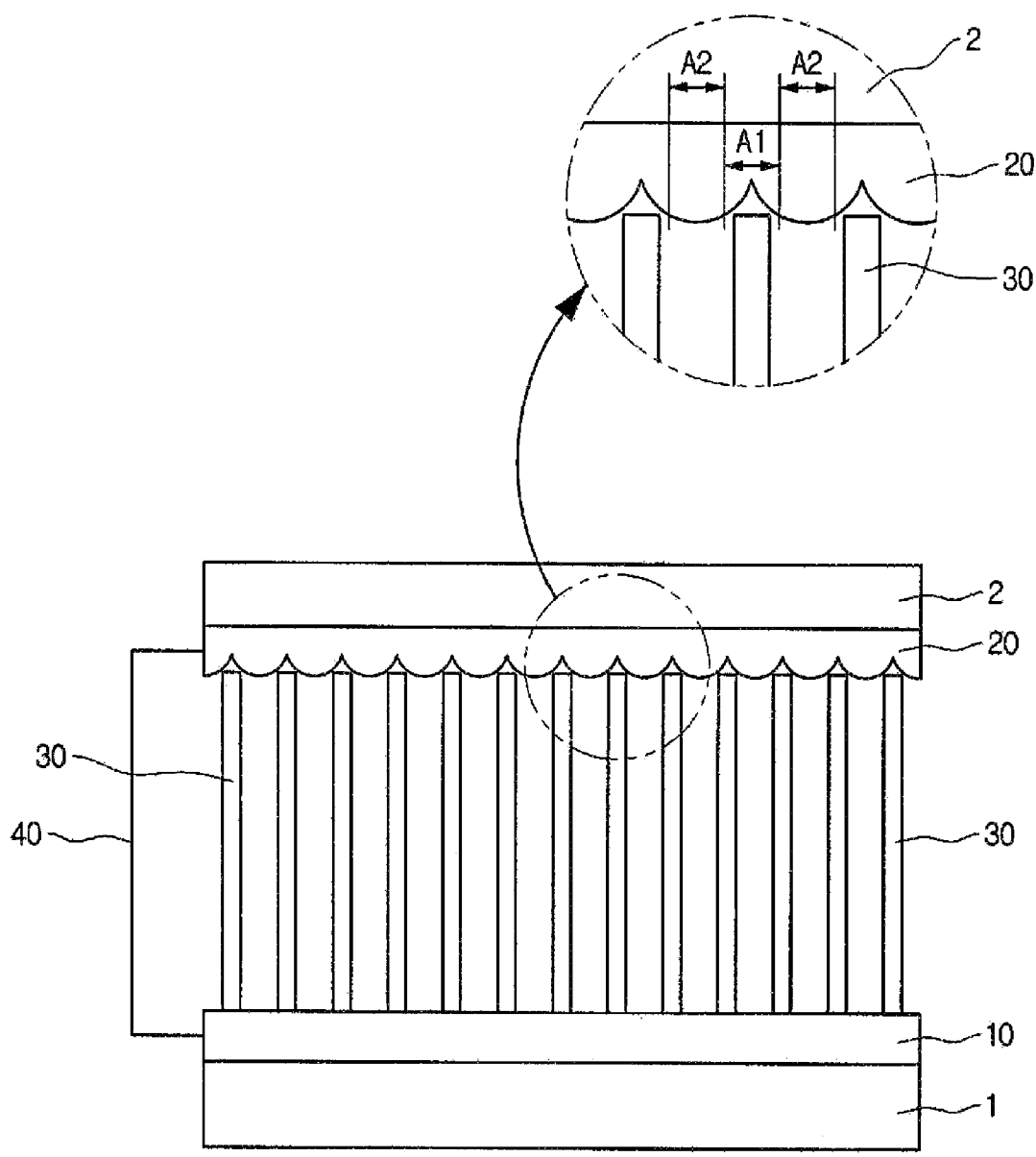
FIG. 2 is a front view of the apparatus for generating electrical energy as illustrated in FIG. 1.

FIG. 1 is a perspective view of an apparatus for generating electrical energy according to an exemplary embodiment, and FIG. 2 is a front view of the apparatus for generating electrical energy illustrated in FIG. 1.

Referring to FIGS. 1 and 2, in one exemplary embodiment the apparatus for generating electrical energy comprises a first electrode 10, a second electrode 20 and a nanowire 30 disposed between the first electrode 10 and the second electrode 20.

The first electrode 10 may be a lower electrode which supports the nanowire 30. In another exemplary embodiment, the first electrode 10 may be formed on a substrate 1 made of glass, silicon (Si), polymer, sapphire, gallium nitride (GaN) or silicon carbide (SiC). In another exemplary embodiment, the first electrode 10 may be a metal film or conductive ceramic formed on the substrate 1.

In another exemplary embodiment, the second electrode 20 may be spaced apart from the first electrode 10, and is electrically connected to the first electrode 10 by a conductor 40. In another exemplary embodiment, the second electrode 20 is formed on a substrate 2 made of glass, silicon (Si), polymer, sapphire, gallium nitride (GaN) or silicon carbide (SiC).

In another exemplary embodiment, the second electrode 20 has one or more concave portions A1, and one or more convex portions A2, and is formed in a ripple shape facing the first electrode 10.

In another exemplary embodiment, at least one of the first electrode 10 and the second electrode 20 is formed of a flexible electrode which can be deformed by an applied stress. In another exemplary embodiment, the first electrode 10 and the second electrode 20 may be formed of a transparent electrode.

In another exemplary embodiment, the first electrode 10 and the second electrode 20 may be formed of at least one of ITO, carbon nanotubes ("CNT"), a conductive polymer, a nanofiber, a nanocomposite, gold-palladium alloy (AuPd), gold (Au), palladium (Pd), platinum (Pt) and ruthenium (Ru).

In another exemplary embodiment, the substrate 1 on which the first electrode 10 is disposed and the substrate 2 on which the second electrode 20 is disposed may be formed of a flexible material which can be deformed by an applied stress. In another exemplary embodiment, the substrates 1, 2 may be formed of a transparent material such as but not limited to glass.

In another exemplary embodiment, the nanowire 30 is disposed between the first electrode 10 and the second electrode 20. In another exemplary embodiment, the nanowire 30 extends in a direction D1 perpendicular to the first electrode 10 and the second electrode 20. In another exemplary embodiment, the nanowire 30 is aligned with the concave portion A1 of the second electrode 20.

The number of the nanowires 30 illustrated in FIGS. 1 and 2 is non-limiting. The number of the nanowires 30 may be varied depending on the size and application of the apparatus.

In another exemplary embodiment, the nanowire 30 is formed on the first electrode 10. It may have several advantages to form the nanowire 30 on the first electrode 10. For example, a conductivity of the nanowire energy generating system may be improved since the nanowire 30 is formed on the first electrode 10 which is a conductor. Further, it may become easier to control the growth of the nanowire 30. For example, the nanowire 30 may be grown vertically on the first electrode 10. Furthermore, a uniformity of the shapes or longitudinal directions of the nanowires 30 may be improved.

In another exemplary embodiment, when a stress is applied to the apparatus for generating electrical energy or a part thereof, the distance between the first electrode 10 and the second electrode 20 is changed resulting in the nanowire 30 between the first electrode 10 and the second electrode 20 being deformed.

In another exemplary embodiment, if the distance between the first electrode 10 and the second electrode 20 is decreased, the nanowire 30 at the corresponding location may become bent in the lengthwise direction D1. The bent nanowire 30 exhibits a piezoelectric effect which results in each portion of the nanowire 30 having different electric potentials depending on the compressive stress or tensile stress applied thereto.

In another exemplary embodiment, the nanowire 30 may be made of a material exhibiting a piezoelectric effect, such as ZnO, for example, but is not limited thereto. Upon the application of a stress the nanowire 30 made of ZnO is bent, resulting in each portion of the nanowire 30 having a different electric potentials due to the asymmetric crystal structure of the ZnO, resulting in an electrical energy being generated. This will be described in further detail when referring to FIG. 3.

In another exemplary embodiment, the nanowire 30 may be made of other materials which exhibit a piezoelectric effect when a stress is applied. In another exemplary embodiment, the nanowires 30 may be made of lead zirconate titanate ("PZT") or barium titanate ($BaTiO_3$), for example, but is not limited thereto.

Figure 3:
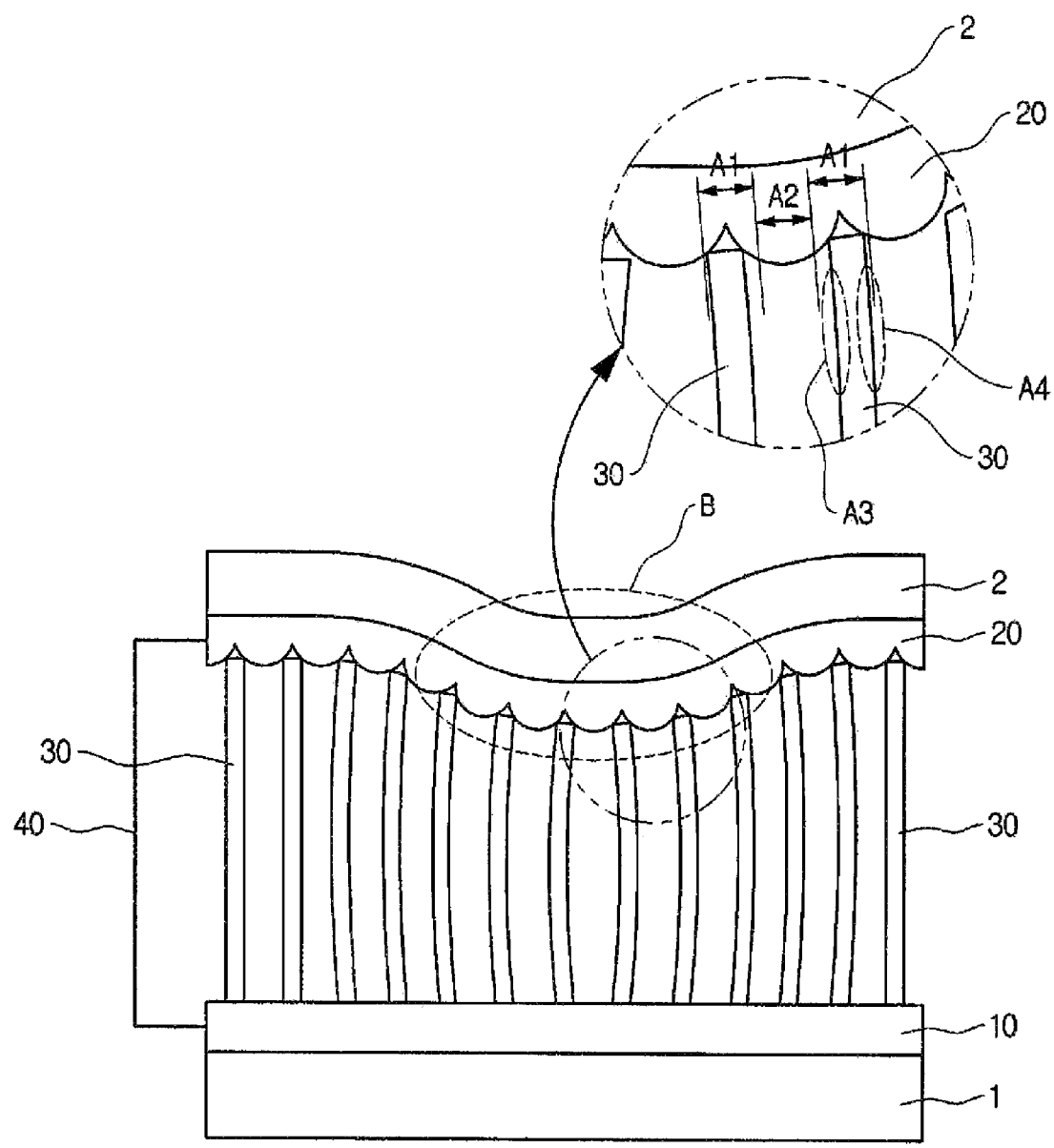
FIG. 3 is a front view showing the apparatus for generating electrical energy illustrated in FIG. 1 where a stress is applied to the apparatus.

FIG. 3 is a front view showing the apparatus for generating electrical energy illustrated in FIG. 1 where a stress is applied to the apparatus.

Referring to FIG. 3, in one exemplary embodiment, as a stress is applied on top of the substrate 2, a portion B of the substrate 2 and the second electrode 20 may be bent downward, as illustrated. As a result, the distance between the first electrode 10 and the second electrode 20 is decreased, and the nanowire 30 positioned between the first electrode 10 and the second electrode 20 may be bent with respect to the lengthwise direction of the nanowire 30. The bent nanowire 30 exhibits a piezoelectric effect. In another exemplary embodiment, the nanowire 30 is made of ZnO, a portion A3 of the nanowire 30 corresponding to where a compressive stress is applied has a negative electric potential, and a portion A4 of the nanowire 30 corresponding to where a tensile stress is applied, opposite the portion A3 of the nanowire, has a positive electric potential.

In another exemplary embodiment, the nanowire 30 is aligned to correspond and be positioned adjacent to the concave portion A1 of the second electrode 20. Accordingly, when the distance between the first electrode 10 and the second electrode 20 is decreased, the nanowire 30 is bent and contacts the second electrode 20.

In another exemplary embodiment, the portion A3 of the nanowire 30 where the compressive stress is applied has a negative electric potential and the second electrode 20 does not have an electric potential. Accordingly, the portion A3 where the compressive stress is applied and the second electrode 20 forms a forward-biased Schottky diode, and an electric current flows from the second electrode 20 toward the nanowire 30. The current flows through a closed loop formed by the second electrode 20, the nanowire 30, the first electrode 10 and the conductor 40.

In another exemplary embodiment, the portion A4 of the nanowire 30 corresponding to where the tensile stress is applied has a positive electric potential. Accordingly, the portion A4 of the nanowire 30 where the tensile stress is applied and the second electrode 20 forms a reverse-biased Schottky diode, and an electric current does not flow.

In another exemplary embodiment, a stress is applied to the second electrode 20 and the distance between the first electrode 10 and the second electrode 20 is decreased, an electric current flows due to a Schottky contact between the portion of the nanowire 30 where a compressive stress is applied and the second electrode 20. Accordingly, it is possible to generate an electrical current in response to the applied stress.

In another exemplary embodiment, illustrated in FIG. 3, a stress is applied to the second substrate 2 and the second electrode 20 is bent. The same effect is achieved if a stress is applied to the first electrode 10 and the second electrode 20. The same effect is also achieved by pressing a portion of the first electrode 10 or the second electrode 20, or by bending the first electrode 10 or the second electrode 20.

Referring to FIG. 1 through FIG. 3, in another exemplary embodiment, the concave portions A1 and the convex portions A2 are formed only on the second electrode 20.

Figure 4:
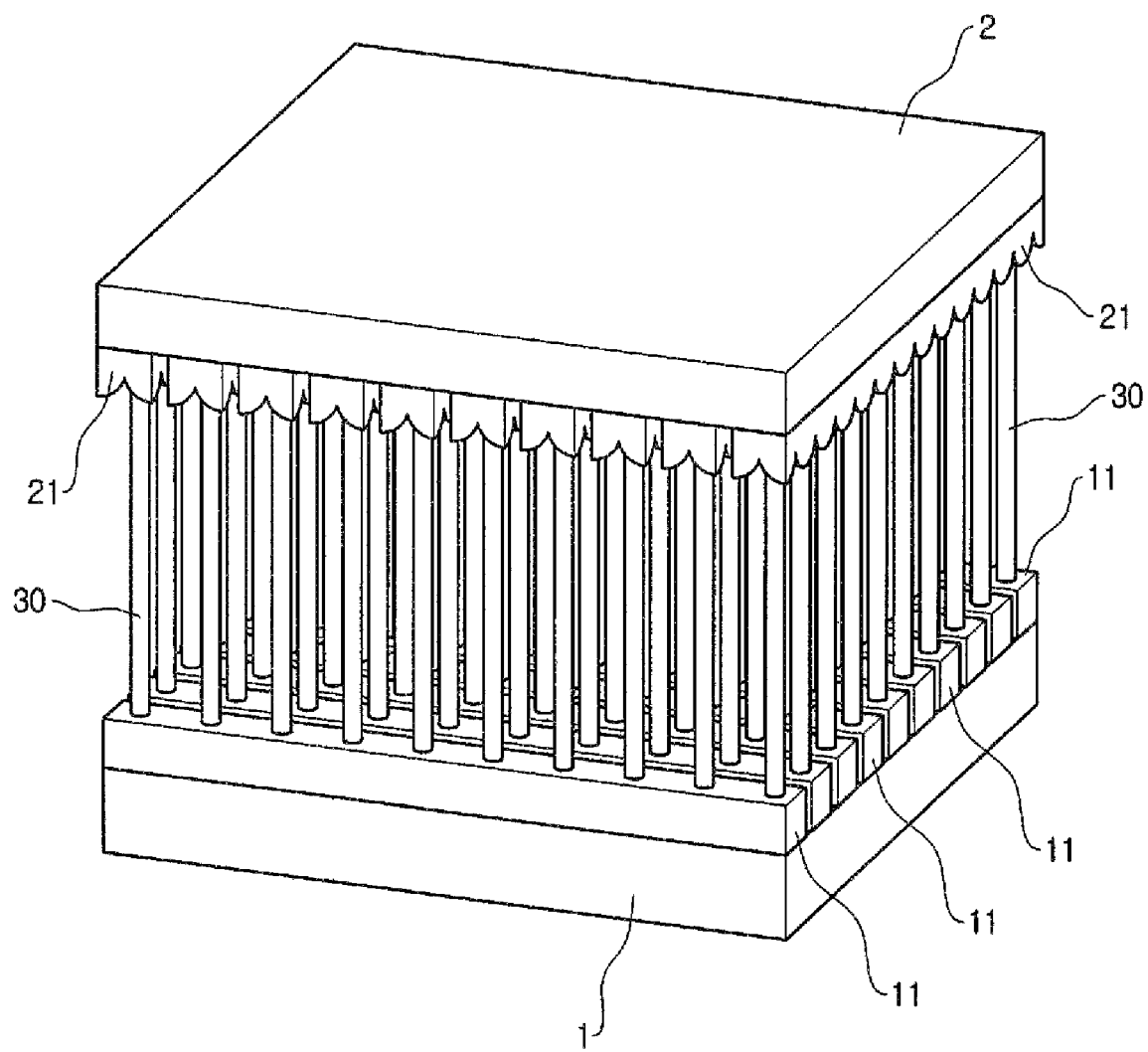
FIG. 4 is a perspective view showing an exemplary embodiment of an apparatus for generating electrical energy according to the present invention.
Figure 5:
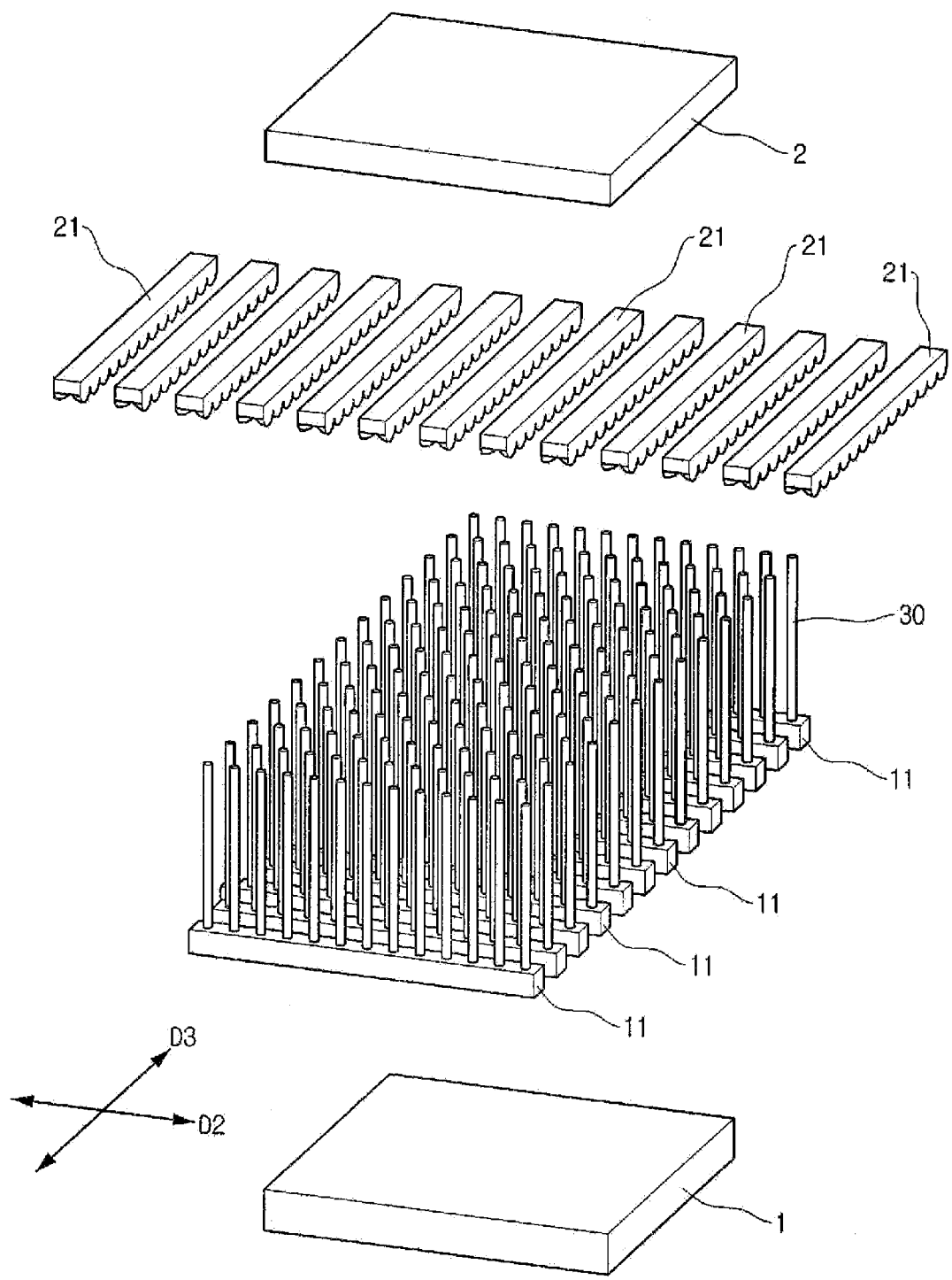
FIG. 5 is an exploded view of the apparatus for generating electrical energy illustrated in FIG. 4.

FIG. 4 is a perspective view of an apparatus for generating electrical energy according to another embodiment, and FIG. 5 is an exploded view of the apparatus for generating electrical energy illustrated in FIG. 4.

In another exemplary embodiment, illustrated in FIGS. 4 and 5, the construction and function of substrates 1, 2 and a nanowire 30 may be the same as those described referring to FIGS. 1 through 3. Therefore, a detailed description thereof will be omitted.

In one exemplary embodiment, the first electrode 11 and the second electrode 21 may be a plurality of first and second electrodes. The plurality of the first electrodes 11 extend along a direction D2 on the substrate 1, and are disposed so as to be spaced apart from one another. The plurality of the second electrodes 21 extend along a direction D3 perpendicular to the direction D2 on the substrate 2, and are disposed so as to be spaced apart from one another.

In another exemplary embodiment, the plurality of the first electrodes 11 and the plurality of the second electrodes 21 extend in directions perpendicular to each other, and form a matrix type array. The number of the first electrodes 11 and the second electrodes 21 illustrated in FIGS. 4 and 5 is not limiting, and the number of the first electrodes 11 and the second electrodes 21 may be varied depending on the size and application of the apparatus.

In another exemplary embodiment, using the apparatus for generating electrical energy, it is possible to detect the electrode where an electric current flows to the plurality of the first electrodes 11 and the electrode where an electric current flows to the plurality of the second electrodes 21. Therefore, it is possible to detect the position where a stress is applied. Accordingly, the apparatus for generating electrical energy may be applied in, but not limited to, a touch sensor to detect the position where a stress is applied.

In another exemplary embodiment, illustrated in FIGS. 4 and 5, the nanowire 30 is disposed on the plurality of first electrodes 11. The nanowire 30 is disposed only on the positions where the first electrodes 11 and the second electrodes 21 cross each other.

In another exemplary embodiment, the second electrodes 21 may extend in the direction perpendicular to the first electrodes 11. In another exemplary embodiment, the second electrodes 21 may extend along a direction inclined to the length direction D2 of the first electrodes 11.

Figure 6:
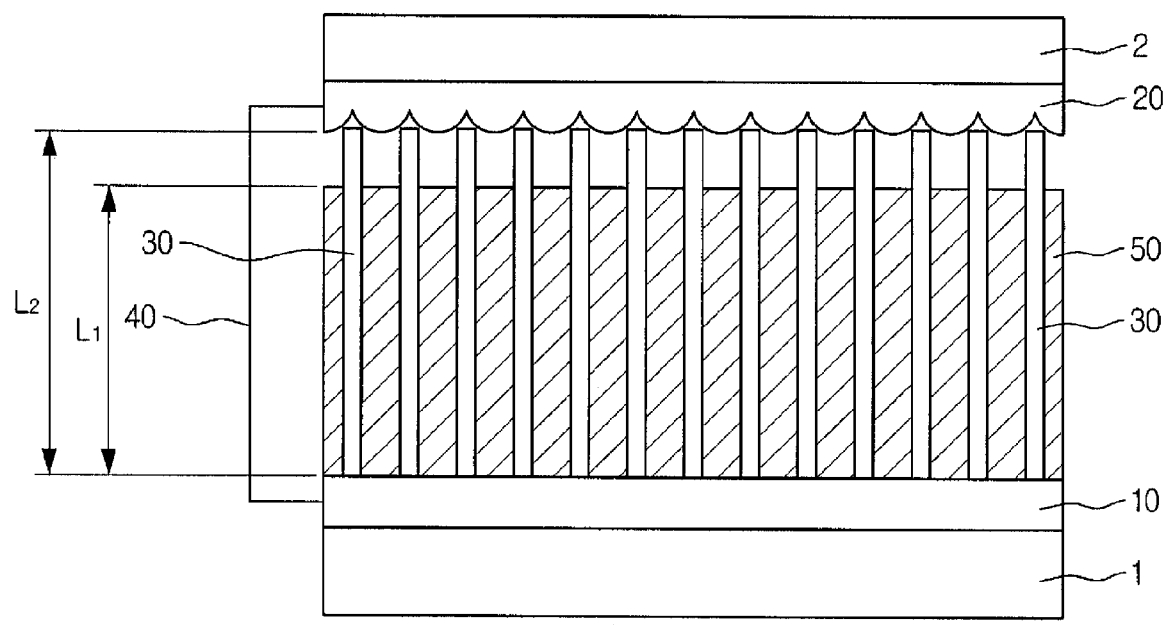
FIG. 6 is a perspective view showing an exemplary embodiment of an apparatus for generating electrical energy according to the present invention.

FIG. 6 is a cross-sectional view of an apparatus for generating electrical energy according to another embodiment.

In another exemplary embodiment, illustrated in FIG. 6, the construction and function of substrates 1, 2 and a nanowire 30 may be the same as those described referring to FIGS. 1 through 3. Therefore, a detailed description thereof will be omitted.

In one exemplary embodiment, an elastic material 50 is disposed between the first electrode 10 and the second electrode 20. The elastic material 50 may prevent the nanowire 30 from being broken when the apparatus for generating electrical energy is pushed or bent. Accordingly, a durability and reliability of the apparatus for generating electrical energy may be improved.

In one exemplary embodiment, the elastic material 50 has a relatively high elasticity. At the same time, the elastic material 50 is formed of a material flexible enough to allow the nanowire 30 to be bent. For example, the elastic material 50 may be formed of at least one of silicone, polydimethylsiloxane (PDMS), and urethane. Alternatively, the elastic material 50 may be formed of other suitable material.

If the nanowire 30 is completely covered with the elastic material 50, the nanowire 30 may not contact the second electrode 20. Therefore, in another exemplary embodiment, a first distance $L_1$ between the first electrode 10 and a top surface of the elastic material 50 is not greater than a second distance $L_2$ between the first electrode 10 and the top surface of the nanowire 30. Accordingly, an end of the nanowire 30 may be exposed, so that the nanowire 30 may contact the second electrode 20 when the nanowire 30 is bent.

In another exemplary embodiment, the apparatuses for generating electrical energy described herein are used in an electronic device for sensing a stress, for example but not limited to, a touch sensor. In another exemplary embodiment, the apparatuses for generating electrical energy described herein are used in a display device, such as but not limited to a touch panel, a touchscreen, etc. or a robot skin.

FIGS. 7a through 7f are cross-sectional views illustrating an exemplary embodiment of a process of preparing a first electrode and a nanowire of an apparatus for generating electrical energy.

Figure 7A:
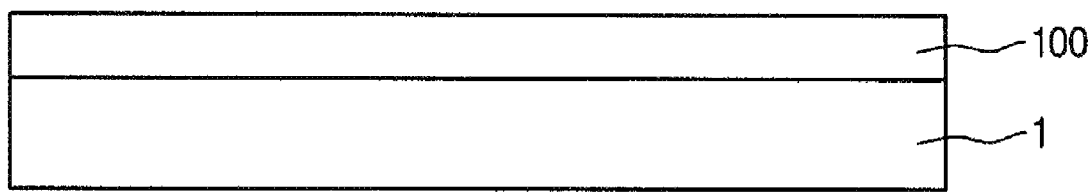
FIGS. 7a through 7f are cross-sectional views showing an exemplary embodiment illustrating a process of preparing a first electrode and a nanowire of an apparatus for generating electrical energy according to the present invention.

In an exemplary embodiment, referring to FIG. 7a, a first electrode layer 100 is disposed on a substrate 1. The substrate 1 may be a substrate made of glass, silicon or polymer. In another exemplary embodiment, the first electrode layer 100 may be made of a flexible conductive material which can be deformed by an applied stress. In another exemplary embodiment, the first electrode layer 100 may be made of a transparent material.

In another exemplary embodiment, the first electrode layer 100 may be formed of at least one of ITO, CNT, a conductive polymer, nanofibers and a nanocomposite. The first electrode layer 100 may also be formed of at least one of AuPd alloy, Au, Pd, Pt and Ru.

The first electrode layer 100 may serve as a lower electrode which supports the nanowire which will be described later.

Figure 7B:
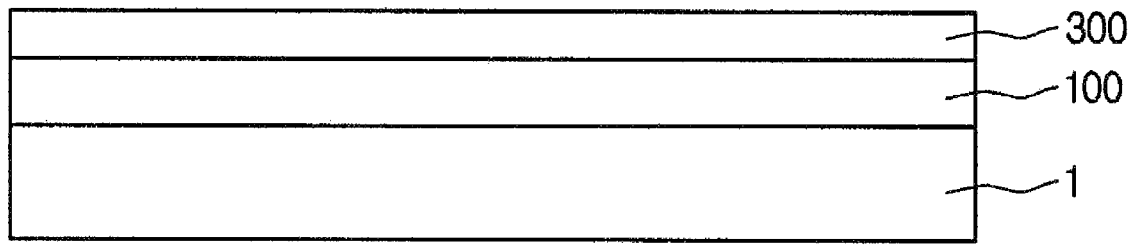

Next, referring to FIG. 7b, a nanomaterial layer 300 is disposed on the first electrode layer 100. The nanomaterial layer 300 may be disposed having a small thickness on the first electrode layer 100 by spin coating or other methods. As a non-limiting example the nanomaterial layer 300 may have a thickness of 3 nm to 50 nm. According to exemplary embodiments, the nanomaterial layer 300 may be formed of zinc acetate.

Figure 7C:
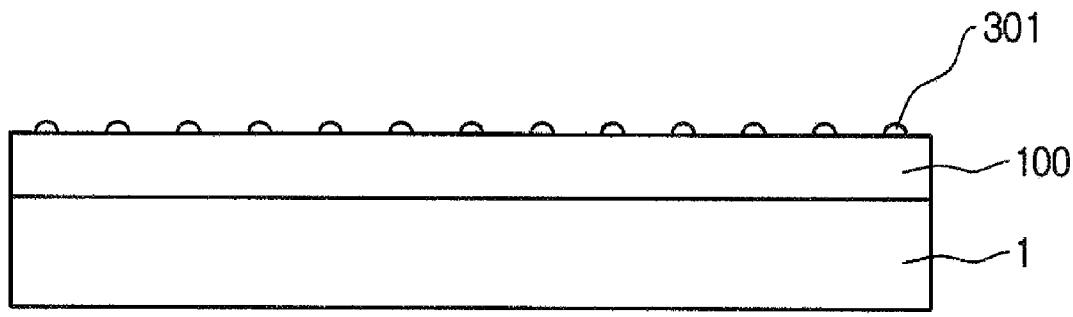

Next, referring to FIG. 7c, the substrate 1 on which the nanomaterial layer 300 (FIG. 7b) has been formed is heated to form one or more nanonuclei 301. As a non-limiting example the nanonucleus 301 is formed by heating the substrate 1 on which the nanomaterial layer has been formed at a temperature of 100° C. to 200° C. followed by drying.

Figure 7D:
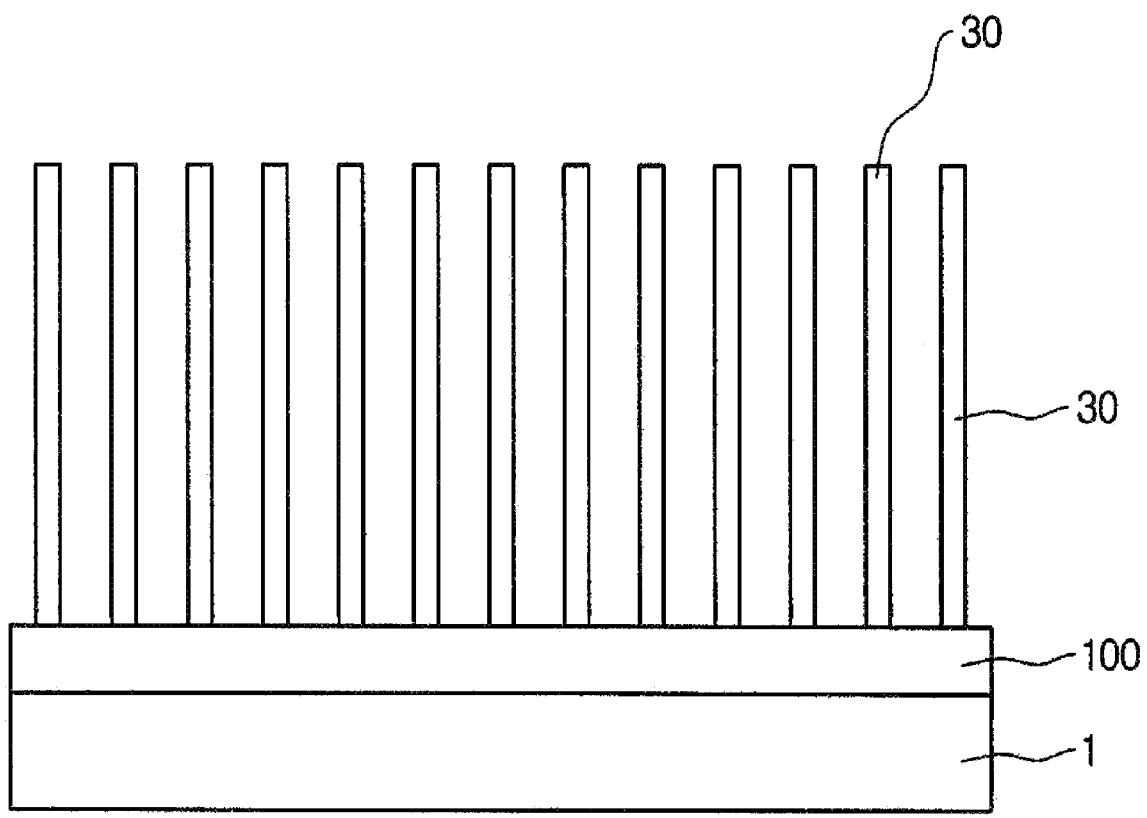

Next, referring to FIG. 7d, the substrate 1 on which the nanonucleus 301 has been formed is immersed in a solution of a nanomaterial so as to grow a nanowire 30 from each nanonucleus 301.

This results in the formation of the first electrode and the nanowire of the apparatus for generating electrical energy.

Figure 7E:
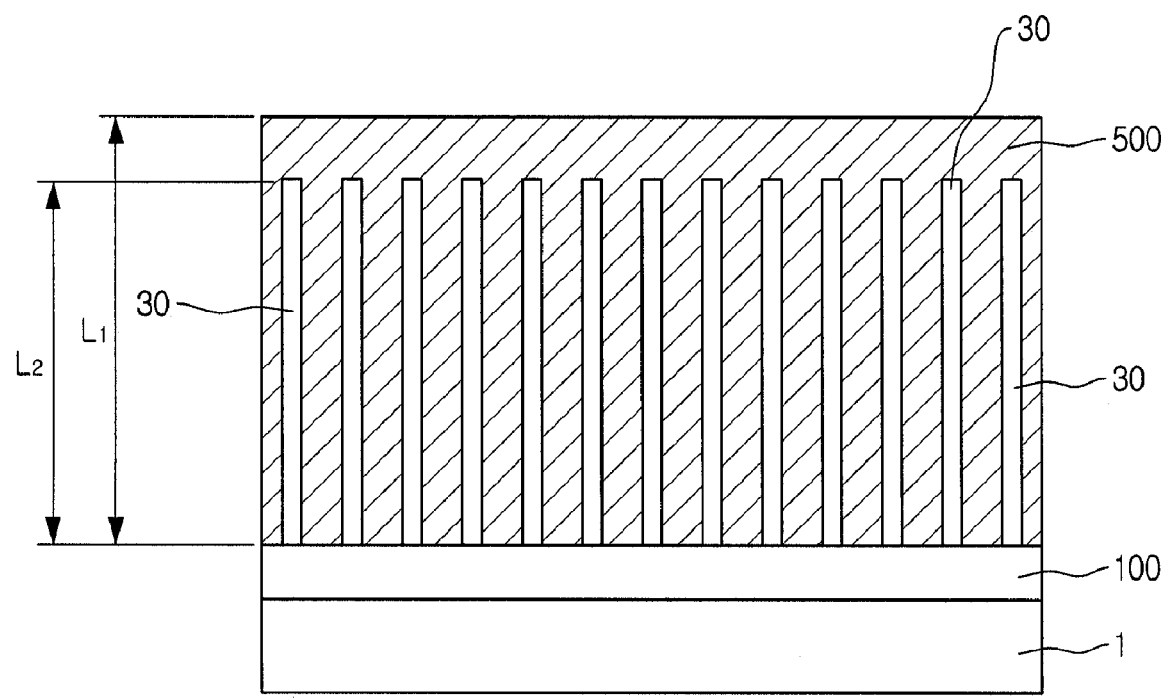
Figure 7F:
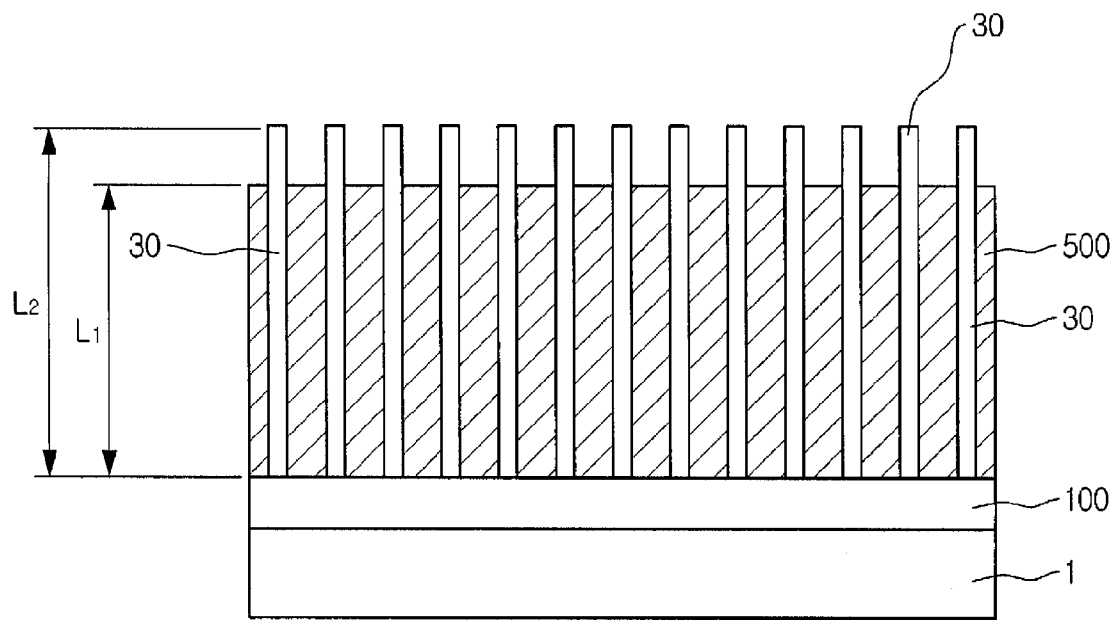

Next, referring to FIG. 7e, an elastic material layer 500 is disposed on the first electrode layer 100 on which the nanowire 30 has been formed. The elastic material layer 500 may prevent the nanowire 30 from being broken. The elastic material layer 500 may be formed of a material having a relatively high elasticity. And the elastic material layer 500 may be formed of a material flexible enough to allow the nanowire 30 to be bent. For example, the elastic material layer 500 may be formed of at least one of silicone, PDMS, and urethane. Alternatively, the elastic material layer 500 may be formed of other suitable material.

In another exemplary embodiment, the elastic material layer 500 is disposed on the first electrode layer 100 using spin coating, dip coating, nozzle printing, or other suitable methods. For example, the elastic material layer 500 may be disposed using nozzle printing by spraying a material on the first electrode layer 100 with a fine nozzle and drying the sprayed material.

In another exemplary embodiment, illustrated in FIG. 7e, a first distance $L_1$ between the first electrode layer 100 and a top surface of the nanowire 30 is greater than a second distance $L_2$ between the first electrode layer 100 and the top surface of the nanowire 30. Alternatively, the first distance $L_1$ may be equal to or less than the second distance $L_2$.

In another exemplary embodiment, if the first distance $L_1$ is greater than the second distance $L_2$, a portion of the elastic material layer 500 is removed to expose an end of the nanowire 30. When the first distance $L_1$ is greater than the second distance $L_2$, the nanowire 30 is completely covered with the elastic material layer 500 and the nanowire 30 may not contact metal. Therefore, a portion of the elastic material layer 500 may be removed so that the first distance $L_1$ is equal to or less than the second distance $L_2$. The elastic material layer 500 may be partially removed by etching methods using ultraviolet (UV) radiation or oxygen ($O_2$) plasma, or other suitable methods.

In another exemplary embodiment, the process for removing a portion of the elastic material layer 500 may be omitted when the elastic material layer 500 is formed so that the first distance $L_1$ is equal to or less than the second distance $L_2$.

FIGS. 8a through 8g are cross-sectional views illustrating an exemplary embodiment of a process of preparing a second electrode of an apparatus for generating electrical energy.

Figure 8A:
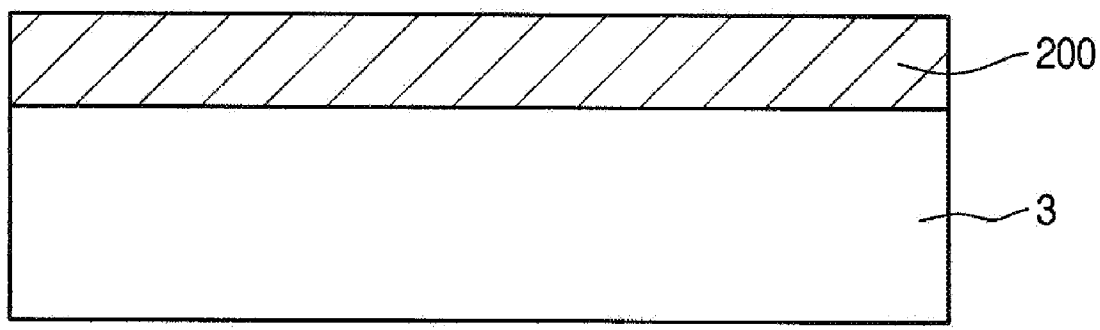
FIGS. 8a through 8g are cross-sectional views showing an exemplary embodiment illustrating a process of preparing a second electrode of an apparatus for generating electrical energy according to the present invention.

First, referring to FIG. 8a, a metal layer 200 is disposed on a template substrate 3. According to exemplary embodiments, the substrate 3 may be a silicon wafer, and the metal layer 200 may be formed of aluminum (Al).

Figure 8B:
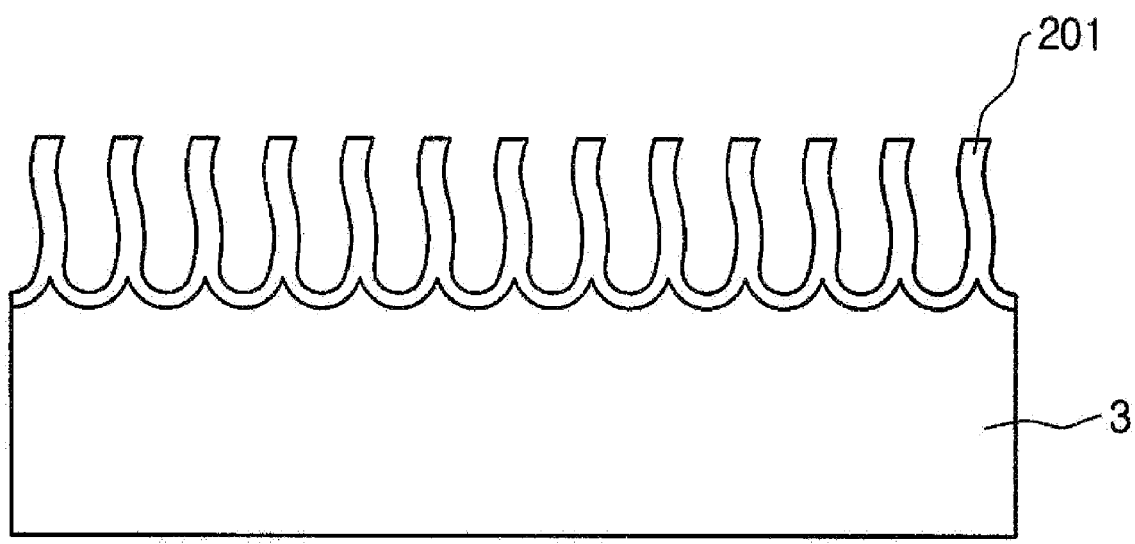

Next, referring to FIG. 8b, the metal layer 200 is anodized to form an anodic film 201. The anodizing is an electrolytic process in an electrolytic solution, with the metal layer 200 as an anode. Through the anodizing, the thickness of the natural oxide layer formed on the metal layer 200 increases as the constituent material of the metal layer 200 dissolves into the electrolyte. The anodic film 201 which is formed as a result of this process is illustrated in FIG. 8b.

Figure 8C:
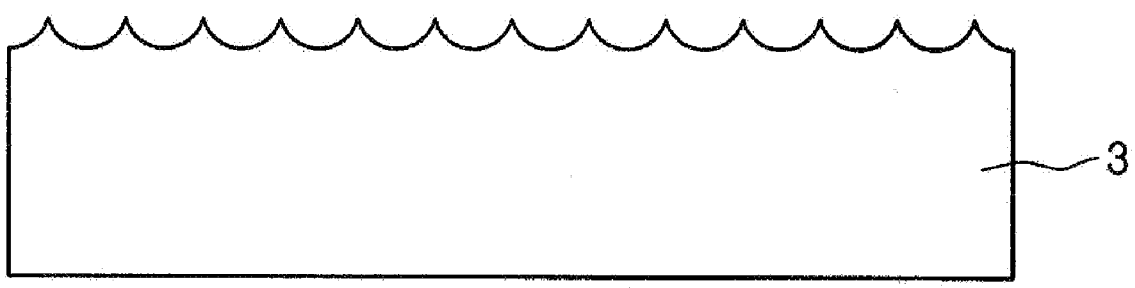

Next, referring to FIG. 8c, the anodic film 201 formed by the anodizing process is removed. The anodic film 201 may be removed, for example, but not limited to, by wet or dry etching. Upon the removal of the anodic film 201, the surface of the template substrate 3 has a ripple-shaped structure with concave portions and convex portions.

Figure 8D:
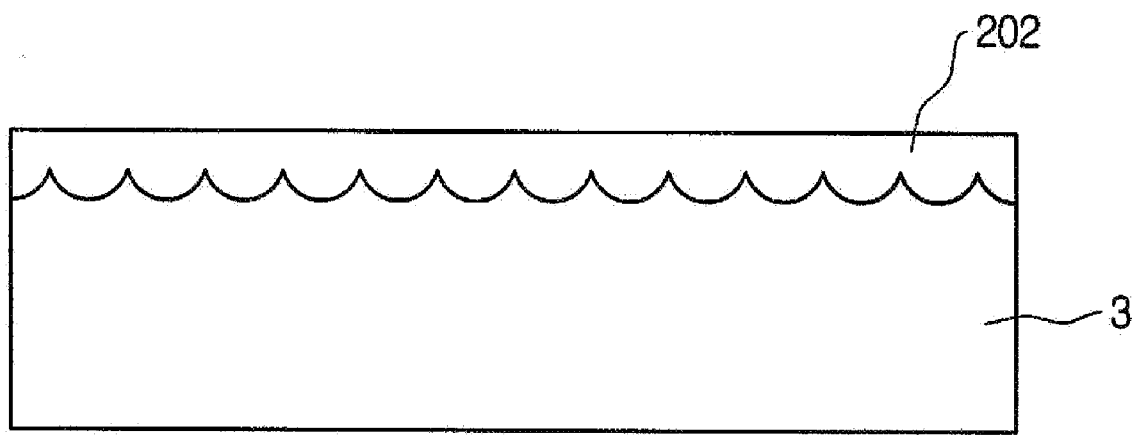

Next, referring to FIG. 8d, a second electrode layer 202 is formed on the template substrate 3. The second electrode layer 202 may serve as an upper electrode which contacts the nanowires and allows for the flow of electrical current.

According to exemplary embodiments, the second electrode layer 202 is formed of at least one of AuPd alloy, Au, Pt, Pd and Ru. Further, the second electrode layer 202 may be formed by ion sputtering.

Also, as in the first electrode layer described above, the second electrode layer 202 may be formed of a flexible conductive material capable of being deformed by an applied stress. Further, the second electrode layer 202 may be made of a transparent material.

For example, the second electrode layer 202 may be formed of at least one of ITO, CNT, a conductive polymer, nanofibers and a nanocomposite.

Figure 8E:
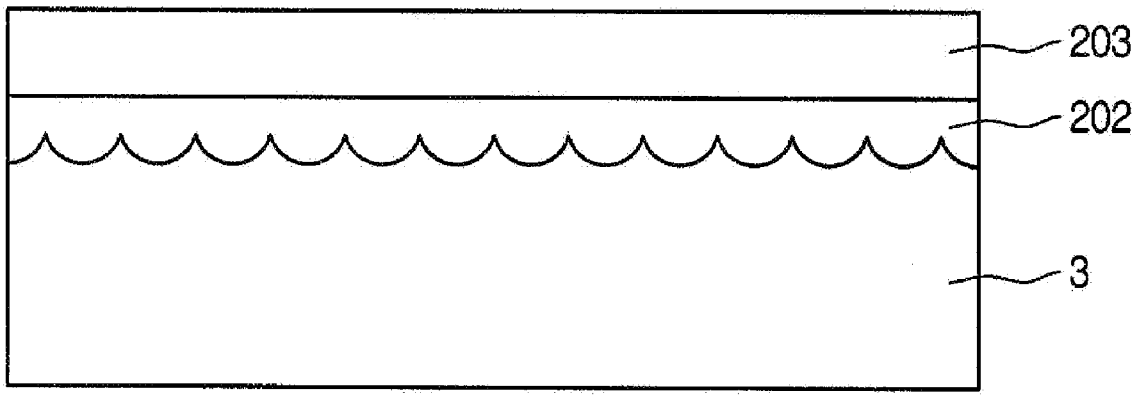

According to exemplary embodiments, an adhesion layer 203 is disposed on the second electrode layer 202, as illustrated in FIG. 8e. The adhesion layer 203 may serve to improve adhesion between the second electrode layer 202 and a carrier substrate which is formed later in the process. According to exemplary embodiments, the adhesion layer 203 may be formed of nickel (Ni). Further, the adhesion layer 203 is formed by electroplating.

Figure 8F:
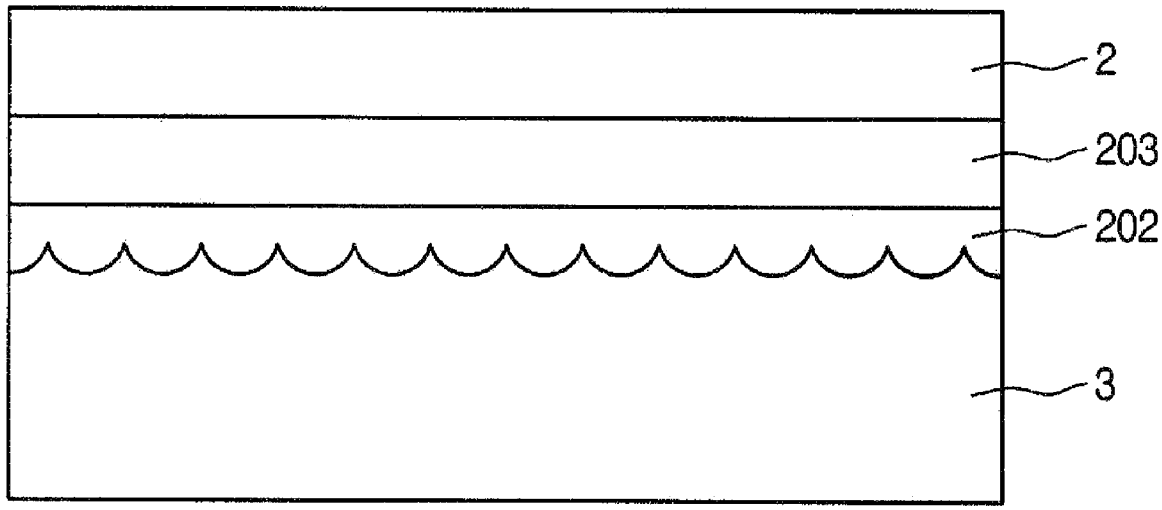

Next, referring to FIG. 8f, a carrier substrate 2 is attached on the adhesion layer 203. In another exemplary embodiment, the carrier substrate 2 may be attached on the second electrode layer 202, without the adhesion layer 203. Further, the carrier substrate 2 may be formed of a polymer.

Figure 8G:
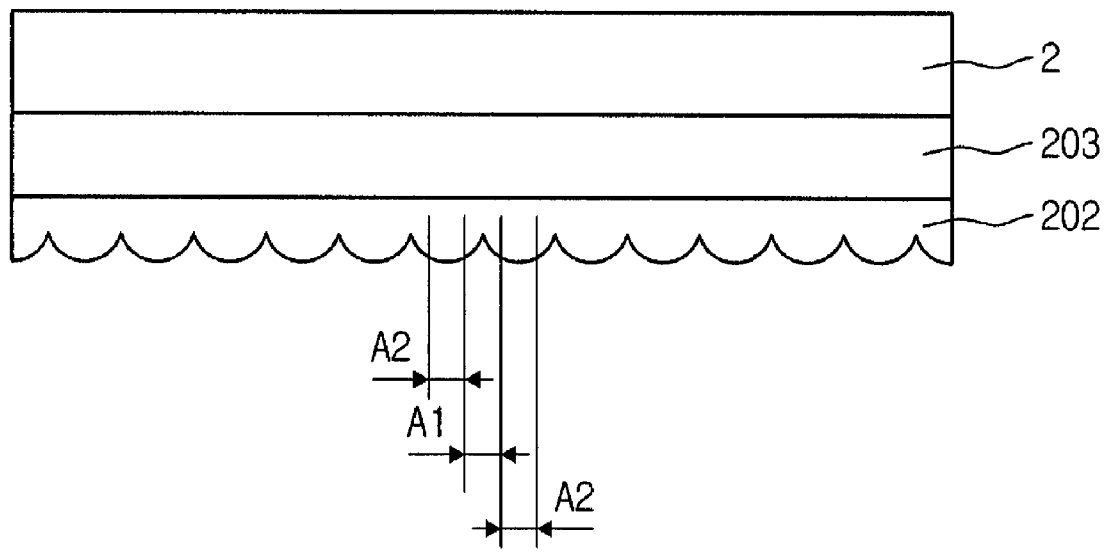

Next, referring to FIG. 8g, the second electrode layer 202, the adhesion layer 203 and the carrier substrate 2 is separated from the template substrate 3. The separated second electrode layer 202 has concave portions A1 and convex portions A2 because of the shape of the template substrate 3.

In another exemplary embodiment, the second electrode which is connected to the first electrode and the nanowire may be formed as described above.

Figure 9A:
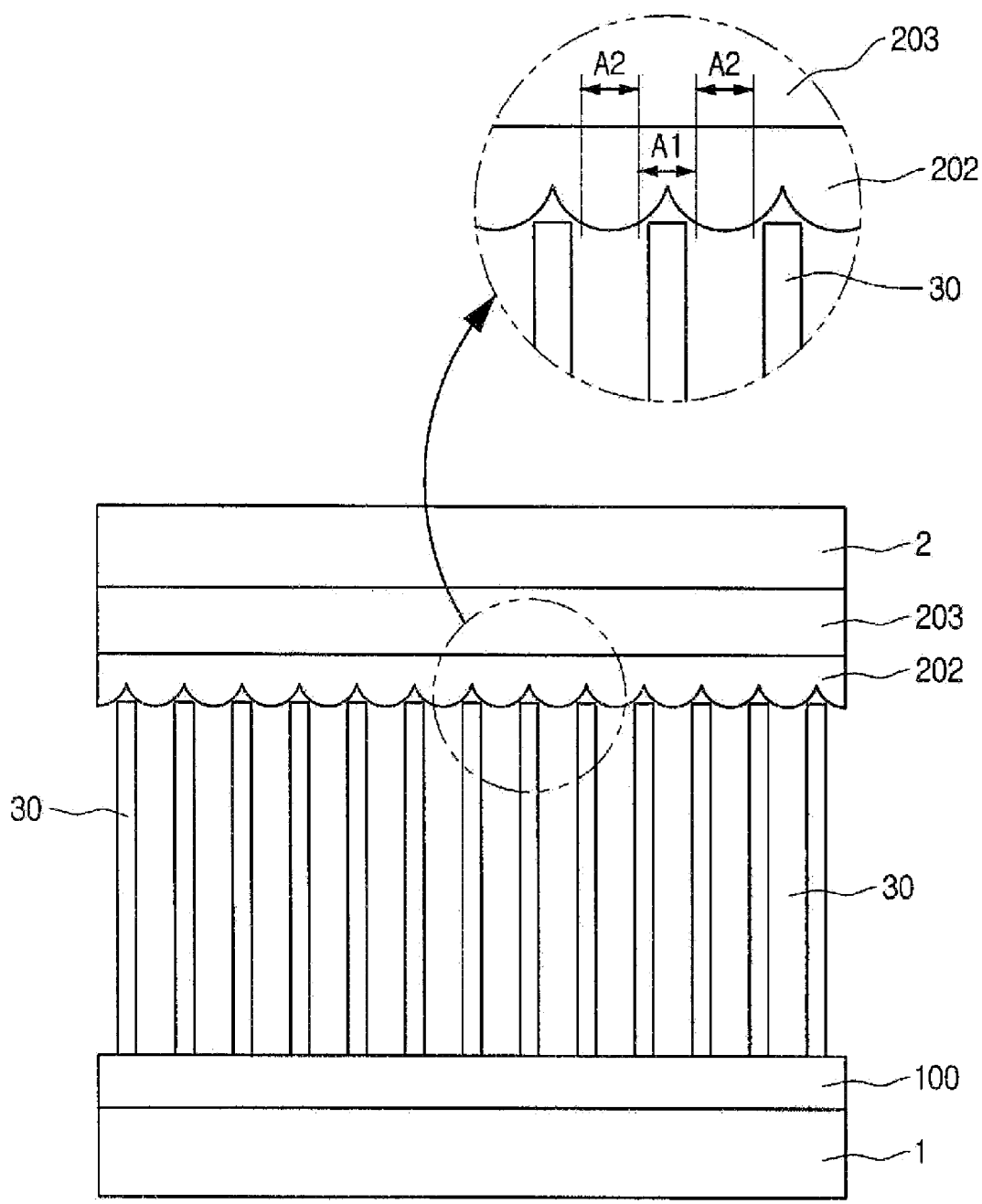
FIGS. 9a and 9b are cross-sectional views showing an exemplary embodiment illustrating a process of bringing the nanowire of the first electrode into proximity to a second electrode to manufacture an apparatus for generating electrical energy according to the present invention.
Figure 9B:
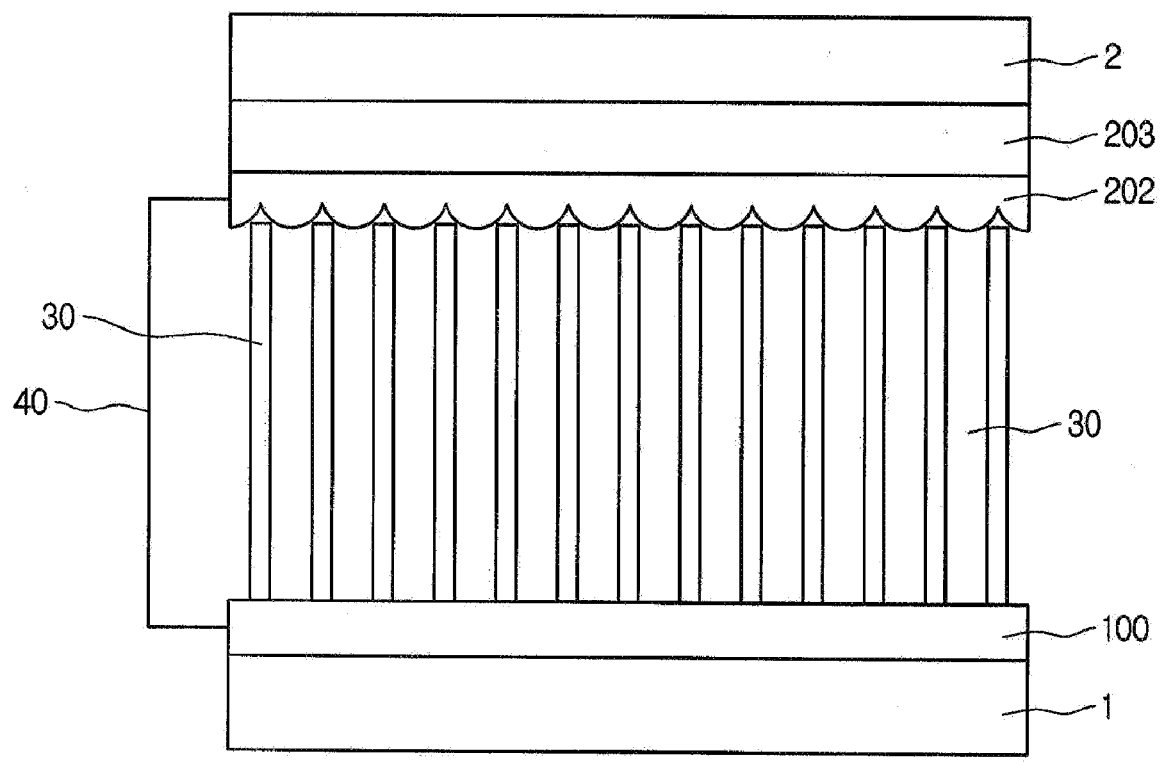

FIGS. 9a and 9b are cross-sectional views illustrating an exemplary embodiment of a process of bringing into proximity a nanowire to a second electrode to manufacture an apparatus for generating electrical energy.

First, referring to FIG. 9a, the nanowire 30 is brought into proximity to the second electrode layer 202. The nanowire 30 may either contact the second electrode layer 202 or be spaced apart from the second electrode layer 202 with a predetermined spacing. In another exemplary embodiment, the nanowire 30 includes a plurality of nanowires, and each of the nanowires 30 may be positioned in proximity to the concave portions A1 of the second electrode layer 202.

Next, referring to FIG. 9b, the first electrode layer 100 and the second electrode layer 202 are connected by the conductor 40 in order to complete the apparatus for generating electrical energy.

Although not shown in FIGS. 9a and 9b, in another exemplary embodiment, an elastic material layer 500 (FIG. 7e) is disposed between the first electrode layer 100 and the second electrode layer 200.

While the exemplary embodiments have been shown and described, it will be understood by those skilled in the art that various changes in form and details may be made thereto without departing from the spirit and scope of the present invention as defined by the appended claims.

In addition, many modifications can be made to adapt a particular situation or material to the teachings of the invention without departing from the essential scope thereof. Therefore, it is intended that the present invention not be limited to the particular exemplary embodiments disclosed as the best mode contemplated for carrying out this invention, but that the present invention will include all embodiments falling within the scope of the appended claims.

What is claimed is:

1. An apparatus for generating electrical energy, comprising:
   a first electrode disposed on a substrate;
   a second electrode spaced apart from the first electrode, the second electrode has a concave portion and a convex portion facing the first electrode;
   a conductor which electrically connects the first electrode to the second electrode;
   a plurality of nanowires formed on the first electrode and disposed between the first electrode and the second electrode, and the plurality of nanowires is deformed in response to a stress applied to the first electrode or the second electrode;
   a first substrate connected to the first electrode; and
   a second substrate connected to the second electrode;
   wherein:
   the first electrode is electrically connected to the plurality of nanowires;
   the first electrode and the plurality of nanowires are formed of different materials;
   an electric current is generated from the plurality of nanowires when the plurality of nanowires is deformed;
   the first electrode and the second electrode are formed of a transparent and flexible material which can be deformed by an applied stress; and
   the first substrate and the second substrate are formed of a transparent and flexible material which can be deformed by an applied stress.

2. The apparatus for generating electrical energy, according to claim 1, wherein the plurality of nanowires is bent as a distance between the first electrode and the second electrode is decreased.

3. The apparatus for generating electrical energy, according to claim 1, wherein the plurality of nanowires is formed of one of the group consisting of zinc oxide, lead zirconate titanate and barium titanate.

4. The apparatus for generating electrical energy, according to claim 1, wherein the plurality of nanowires is positioned to be aligned with and in proximity to the concave portion of the second electrode.

5. The apparatus for generating electrical energy, according to claim 1, wherein the first electrode and the second electrode include a plurality of first and second electrodes, respectively, the plurality of the first electrodes are spaced apart from each other and extend in one direction, and the plurality of the second electrodes are spaced apart from each other and extend in a direction perpendicular to the one direction.

6. The apparatus for generating electrical energy, according to claim 1, further comprising an elastic material disposed between the first electrode and the second electrode, wherein a first distance between the first electrode and a top surface of the elastic material is equal to or less than a second distance between the first electrode and the top surface of the elastic material.

7. The apparatus for generating electrical energy, according to claim 6, wherein the elastic material is formed of at least one of the group consisting of silicone, polydimethylsiloxane, and urethane.

* * * * *